(12) United States Patent
Hirano et al.

(10) Patent No.: US 10,886,101 B2
(45) Date of Patent: Jan. 5, 2021

(54) CHARGED PARTICLE BEAM DEVICE

(71) Applicant: Hitachi High-Tech Corporation, Minato-ku (JP)

(72) Inventors: Ryo Hirano, Tokyo (JP); Hideo Morishita, Tokyo (JP); Toshihide Agemura, Tokyo (JP); Junichi Katane, Tokyo (JP); Tsunenori Nomaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/494,595

(22) PCT Filed: Mar. 29, 2017

(86) PCT No.: PCT/JP2017/012782
§ 371 (c)(1),
(2) Date: Sep. 16, 2019

(87) PCT Pub. No.: WO2018/179115
PCT Pub. Date: Oct. 4, 2018

(65) Prior Publication Data
US 2020/0090903 A1    Mar. 19, 2020

(51) Int. Cl.
*H01J 37/28* (2006.01)
*H01J 37/12* (2006.01)
(Continued)

(52) U.S. Cl.
CPC .............. *H01J 37/28* (2013.01); *H01J 37/12* (2013.01); *H01J 37/145* (2013.01); *H01J 37/153* (2013.01); *H01J 2237/141* (2013.01)

(58) Field of Classification Search
None
See application file for complete search history.

(56) References Cited

U.S. PATENT DOCUMENTS 4,419,581 A * 12/1983 Nakagawa ............... H01J 37/28
250/396 ML
4,926,054 A *  5/1990 Frosien ................. H01J 37/145
250/396 R
(Continued)

FOREIGN PATENT DOCUMENTS

GB    2092365 A  *  8/1982  ............. H01J 37/28
GB    2092365 B  *  4/1985  ............. H01J 37/28
(Continued)

OTHER PUBLICATIONS

International Search Report (PCT/ISA/210) issued in PCT Application No. PCT/JP2017/012782 dated Aug. 1, 2017 with English translation (five (5) pages).
(Continued)

*Primary Examiner* — Andrew Smyth
(74) *Attorney, Agent, or Firm* — Crowell & Moring LLP

(57) ABSTRACT

A charged particle beam device includes: a charged particle source that emits a charged particle beam; a boosting electrode disposed between the charged particle source and a sample to form a path of the charged particle beam and to accelerate and decelerate the charged particle beam; a first pole piece that covers the boosting electrode; a second pole piece that covers the first pole piece; a first lens coil disposed outside the first pole piece and inside the second pole piece to form a first lens; a second lens coil disposed outside the second pole piece to form a second lens; and a control electrode formed between a distal end portion of the first pole piece and a distal end portion of the second pole piece to control an electric field formed between the sample and the distal end portion of the second pole piece.

10 Claims, 5 Drawing Sheets

(51) Int. Cl.
*H01J 37/145* (2006.01)
*H01J 37/153* (2006.01)

(56) References Cited

U.S. PATENT DOCUMENTS

| | | | | |
|---|---|---|---|---|
| 2009/0256076 A1* | 10/2009 | Fukuda | ................ | H01J 37/145 |
| | | | | 250/311 |
| 2015/0221468 A1 | 8/2015 | Nomaguchi et al. | | |
| 2015/0279609 A1* | 10/2015 | Tanii | ................ | H01J 37/21 |
| | | | | 250/398 |
| 2015/0294833 A1* | 10/2015 | Fukuda | ................ | H01J 37/147 |
| | | | | 250/310 |

FOREIGN PATENT DOCUMENTS

| | | | | |
|---|---|---|---|---|
| JP | 57-118357 A | | 7/1982 | |
| JP | 57118357 U | * | 7/1982 | |
| JP | 63-117049 U | | 7/1988 | |
| JP | 1-298633 A | | 12/1989 | |
| JP | 2014-82140 A | | 5/2014 | |
| WO | WO-9813854 A1 | * | 4/1998 | ............ H01J 37/141 |
| WO | WO 2014/030433 A1 | | 2/2014 | |

OTHER PUBLICATIONS

Japanese-language Written Opinion (PCT/ISA/237) issued in PCT Application No. PCT/JP2017/012782 dated Aug. 1, 2017 (seven (7) pages).

Japanese-language Office Action issued in Japanese Application No. 2019-508407 dated Sep. 29, 2020 with English translation (eight (8) pages).

* cited by examiner

[FIG. 1]
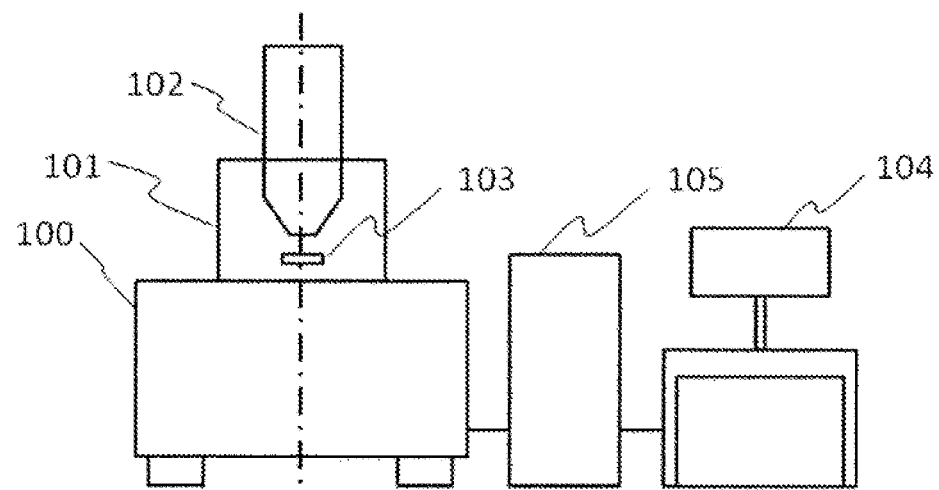
[FIG. 2]
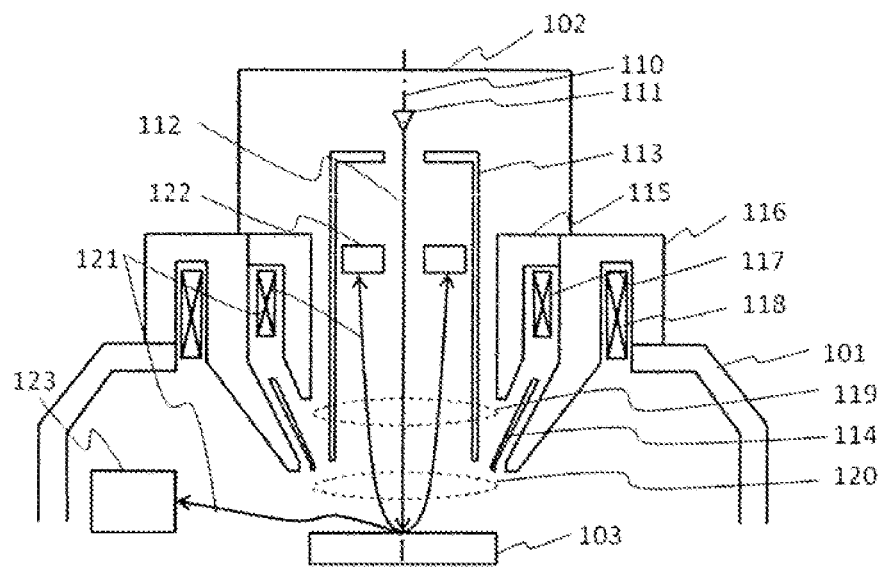

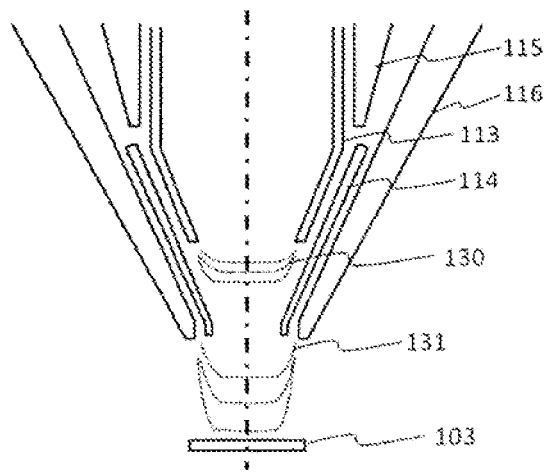
[FIG. 3A]
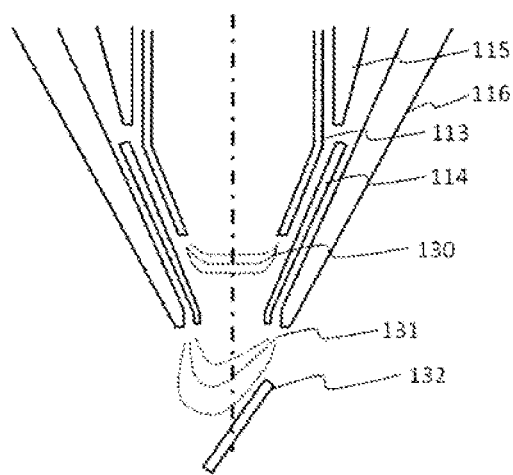
[FIG. 3B]
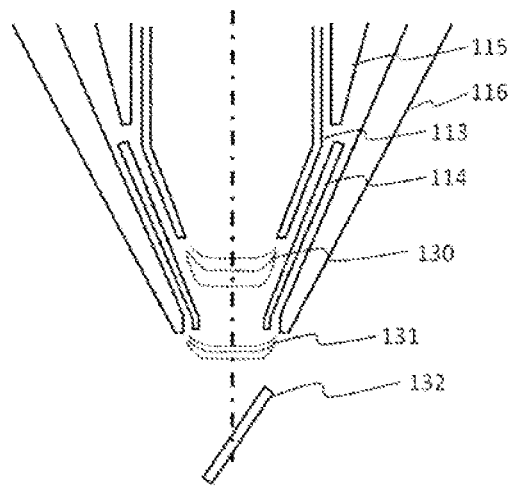
[FIG. 3C]

[FIG. 4A]
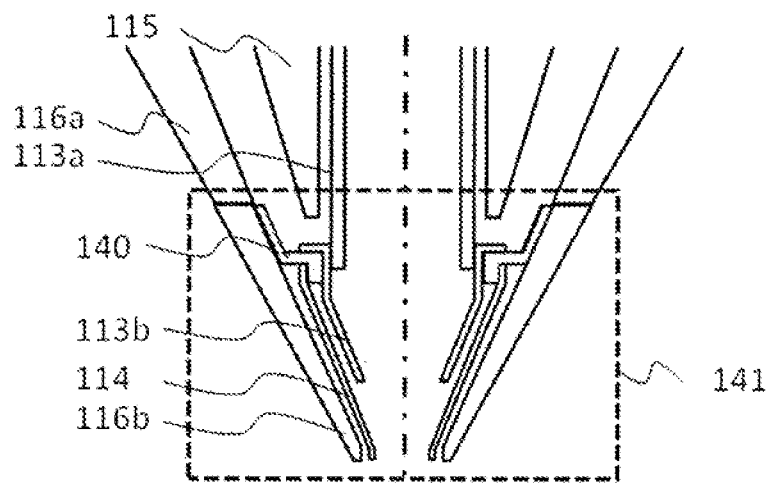
[FIG. 4B]
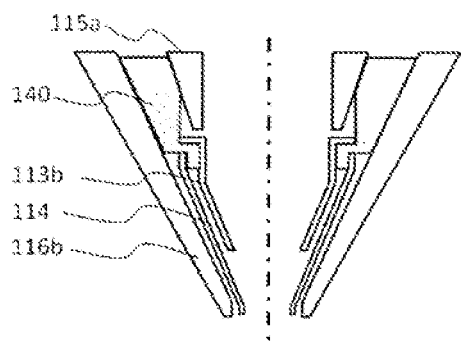
[FIG. 4C]
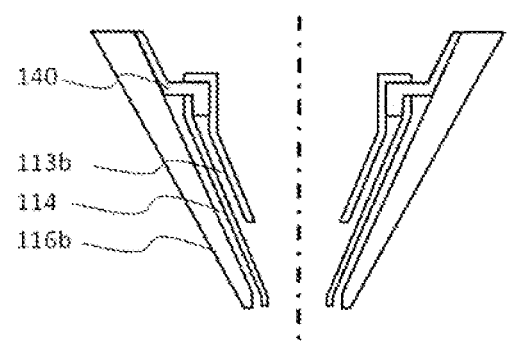
[FIG. 5]
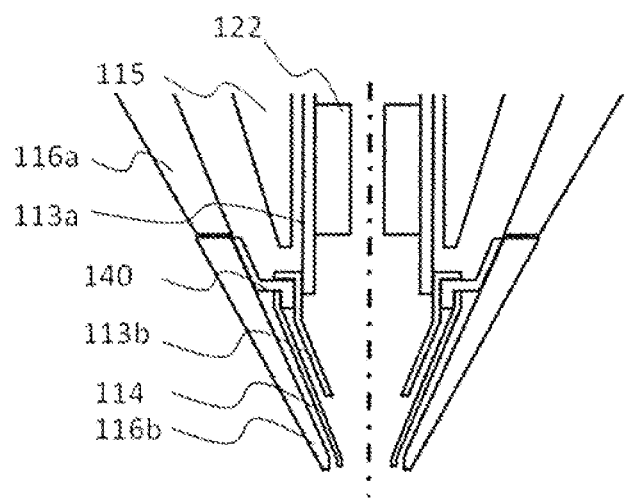

[FIG. 6A]
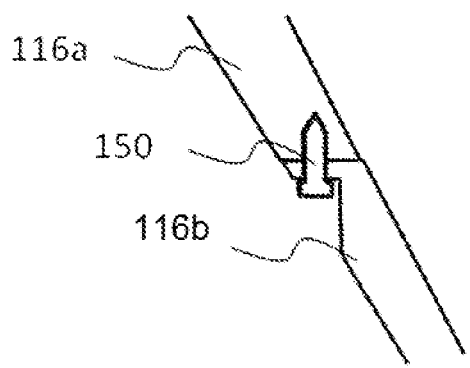
[FIG. 6B]
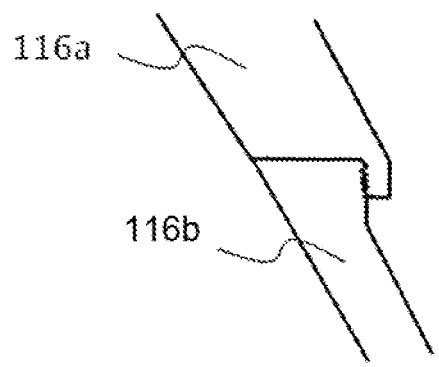
[FIG. 6C]
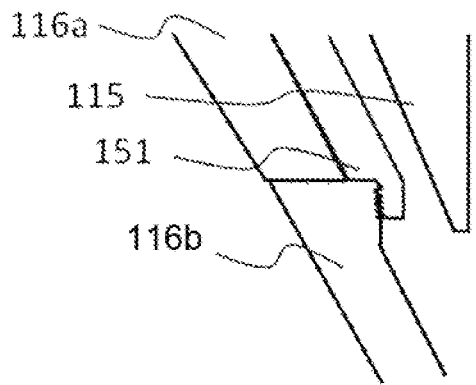
[FIG. 6D]
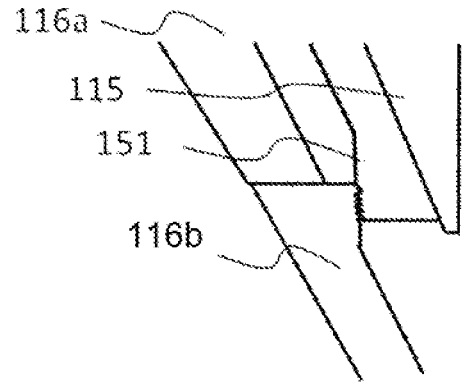
[FIG. 7A]
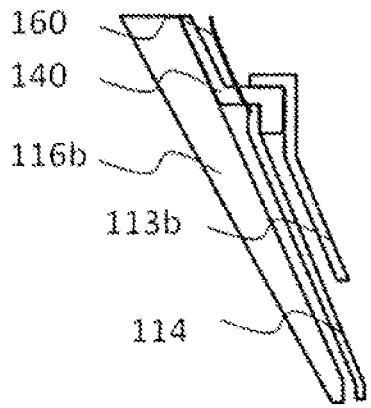
[FIG. 7B]
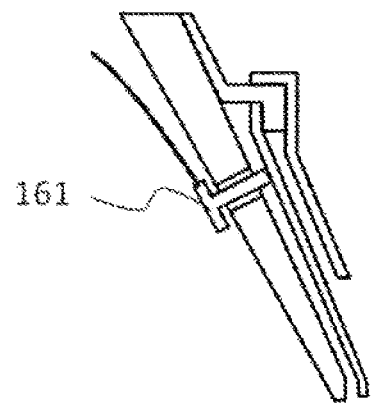

[FIG. 8]
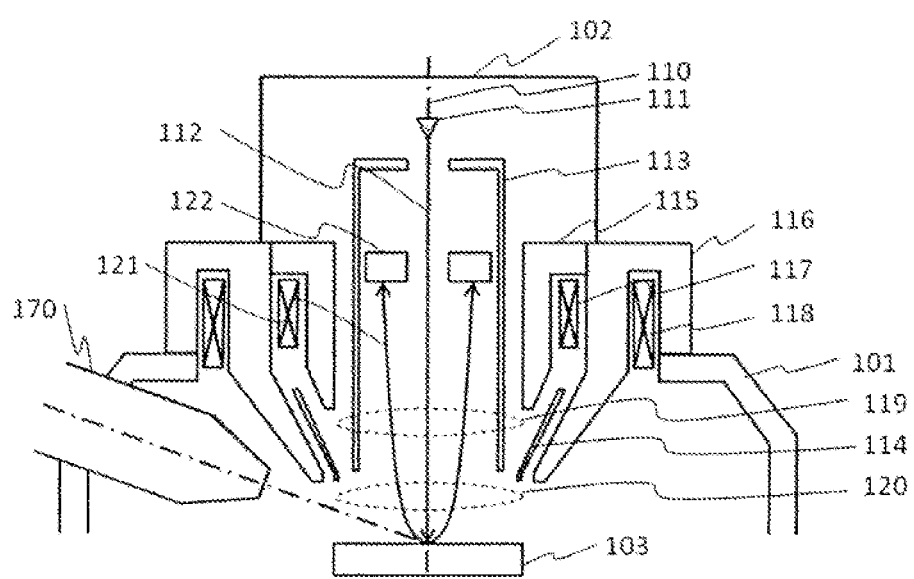

CHARGED PARTICLE BEAM DEVICE

TECHNICAL FIELD

The present invention relates to a charged particle beam device.

BACKGROUND ART

There is disclosed a technique of using a boosting type magnetic field lens on which an electric field lens is superimposed in a charged particle beam device (see Patent Literature 1). An advantage of an objective lens of Patent Literature 1 is, for example, high resolution in low energy observation by a deceleration electrostatic field.

PRIOR ART LITERATURE

Patent Literature

PTL1: JP-A-1-298633

SUMMARY OF INVENTION

Technical Problem

According to Patent Literature 1, resolution may deteriorate depending on a condition of a sample. For example, when a sample surface has irregularities or when the sample is inclined with respect to an optical axis through which a charged particle beam passes, the electric field lens formed on the sample is distorted and the performance of the objective lens is degraded.

Therefore, an object of the invention is to provide a charged particle beam device capable of realizing high resolution observation by preventing distortion of the electric field lens.

Solution to Problem

A charged particle beam device according to an aspect of the invention includes: a charged particle source that emits a charged particle beam; a boosting electrode disposed between the charged particle source and a sample to form a path of the charged particle beam and to accelerate and decelerate the charged particle beam; a first pole piece that covers the boosting electrode; a second pole piece that covers the first pole piece; a first lens coil disposed outside the first pole piece and inside the second pole piece to form a first lens; a second lens coil disposed outside the second pole piece to form a second lens; and a control electrode formed between a distal end portion of the first pole piece and a distal end portion of the second pole piece to control an electric field formed between the sample and the distal end portion of the second pole piece.

Advantageous Effect

According to the invention, it is possible to provide a charged particle beam device capable of realizing high resolution observation by preventing distortion of an electric field lens.

BRIEF DESCRIPTION OF DRAWINGS

FIG. 1 is a schematic view of an SEM.
FIG. 2 is a detailed view of the SEM.
FIGS. 3A to 3C are schematic views of a deceleration electric field.
FIGS. 4A to 4C are cross-sectional views of a division unit of various components forming an objective lens.
FIG. 5 is a cross-sectional view of an in-housing detector mounted on a division position.
FIGS. 6A to 6D are schematic views of methods of fixing the division unit.
FIGS. 7A to 7B are schematic views of methods of introducing a voltage to a control electrode.
FIG. 8 is a schematic view of an FIB-SEM.

DESCRIPTION OF EMBODIMENTS

The following embodiments describe a scanning electron microscope (hereinafter referred to as "SEM") as an example of a charged particle beam device; however, the invention is not limited thereto, and can be applied to a focused ion beam-scanning electron microscope (hereinafter referred to as "FIB-SEM"), a scanning transmission electron microscope (STEM), and the like.

First Embodiment

FIG. 1 is a schematic view of the SEM. The SEM includes an SEM housing 102 that irradiates a sample 103 with a primary charged particle beam (here, a primary electron beam), a sample chamber 101 on which the housing 102 is mounted and that accommodates the sample during observation, a base frame 100 on which the sample chamber 101 is mounted, a monitor (display unit) 104 that displays an image, and a control unit 105 that controls a system of the entire SEM.

FIG. 2 is a detailed view of the SEM. The SEM housing 102 includes an electron source 111 that emits a primary electron beam 112, an objective lens that focuses the primary electron beam 112 onto the sample 103, a boosting electrode 113 and a control electrode 114 that accelerate the primary electron beam 112 from directly below the electron source 110 to a distal end of the objective lens so as to pass the objective lens in a high energy state, and detectors 122 and 123 that detect signal electrons 121 generated from the sample 103 by irradiation of the primary electron beam 112. When the primary electron beam 112 is accelerated by the boosting electrode 113 and the control electrode 114, the energy of the primary electron beam 112 becomes high when receiving a focusing action by the objective lens, and accordingly lens aberration is reduced and resolution is improved.

Here, the objective lens is an electric field superimposed type magnetic field lens having two modes. One is a non-immersion type magnetic field lens 119 (non-immersion mode) with no magnetic field leakage onto the sample; the other is an immersion type magnetic field lens 120 (immersion mode) that forms a magnetic field on the sample. The former is suitable for analysis without the influence of a magnetic field and for observation of a magnetic sample since there is no leakage of a magnetic field on the sample; the latter is suitable for high resolution observation by shortening a lens focal length by forming a magnetic field on the sample. In this way, it is possible to perform a wide range of analysis by selectively using the lens mode of the magnetic field lens in accordance with the use.

The non-immersion magnetic lens 119 (first lens) is formed between a first pole piece 115 and a second pole piece 116 bypassing current to a first lens coil 117 disposed outside the first pole piece 115 and inside the second pole piece 116. On the other hand, the immersion type magnetic field lens 120 (second lens) is formed between the second pole piece 116 and the sample 103 by causing a current to flow through a second lens coil 118 disposed outside the second pole piece 116. The intensity of these magnetic field lenses can be controlled by controlling the currents flowing through the coils by the control unit 105 so that the primary electron beam 112 is focused on the sample 103.

The first pole piece 115 and the second pole piece 116 have an axisymmetric hollow cone shape, and are formed by a soft magnetic material such as pure iron or permendur. Further, an open hole of the second pole piece 116 on the sample side is smaller than an open hole of the first pole piece 115 on the sample side.

The first pole piece 115 and the second pole piece 116 are disposed between the electron source 111 and the sample 103 and the second pole piece 116 is disposed outside the first pole piece 115. A sample side distal end portion of the second pole piece 116 is disposed closer to the sample than a sample side distal end portion of the first pole piece 115.

Detectors that detect signal electrons include the in-housing detectors 122 mounted in the SEM housing 102 and the sample chamber detector 123 mounted in the sample chamber 101. For example, a detector using a scintillator or a detector using a semiconductor is used.

FIGS. 3A to 3C are schematic views of a deceleration electric field, in which FIG. 3A shows a second deceleration electric field formed on the sample, FIG. 3B shows a second deceleration electric field at the time of sample inclination, and FIG. 3C shows a reduced second deceleration electric field.

The boosting electrode 113 has a hollow cylindrical shape that is axisymmetrical with respect to an optical axis 110, and is disposed inside the first pole piece 115 from directly below the electron source to below a distal end of the first pole piece 115 on the sample side.

The control electrode 114 has a hollow cone shape that is axisymmetrical with respect to the optical axis 110, and is disposed between the boosting electrode 113 and the second pole piece 116.

A positive voltage is applied to the boosting electrode 113, and a voltage lower than that of the boosting electrode 113 and higher than that of the sample 103 is applied to the control electrode 114. When voltage values of the boosting electrode 113 and the control electrode 114 are different, a first deceleration electric field 130 that decelerates the primary electron beam 112 is formed by a potential difference, and a second deceleration electric field 131 that decelerates the primary electron beam 112 is formed by a potential difference of the control electrode 114 and the second pole piece 116 and the sample 103. Here, a distance between the distal end portion of the second pole piece 116 and the sample 103, as well as the voltage applied to the control electrode 114, is set to an appropriate value. In this way, the second deceleration electric field 131 is formed mainly by the potential difference between the control electrode 114 and the second pole piece 116 and the electric field leakage onto the sample 103 can be prevented.

That is, the boosting electrode 113, the control electrode 114, the second pole piece 116, and the sample 103 are disposed electrically independent of one another and $V_s \leq V_c \leq V_b$ is satisfied when the voltage applied to the sample 103 is defined as $V_s$, the voltage applied to the control electrode 114 is defined as $V_c$, and the voltage applied to the boosting electrode 113 is defined as $V_b$.

For example, when the distance between the distal end portion of the second pole piece 116 and the sample 103 is 4 mm, the electric field leakage on the sample can be prevented if the voltage value of the control electrode 114 is about 100 V with respect to the grounded sample. Therefore, it is possible to prevent the distortion of the second deceleration electric field 131 generated depending on the sample form such as irregularities on the sample surface and sample inclination, and to prevent degradation of the lens performance generated depending on the sample form.

Further, the voltage values of the boosting electrode 113 and the control electrode 114 can be arbitrarily changed by a GUI (display unit 104) that operates the SEM. Therefore, it is easy to change the voltage values of the electrodes under the observation condition.

Here, by setting the voltage of the boosting electrode 113 to a constant value at the time of switching the mode of the objective lens and changing only the voltage value of the control electrode, it is possible to use the objective lens regardless of the change in the optical condition accompanying the change in the voltage value of the boosting electrode 113.

Next, an operation principle of the SEM will be described. The primary electron beam 112 emitted from the electron source 111 travels at a high speed in the cylinder of the boosting electrode 113. In the case of the non-immersion mode, the primary electron beam 112 is subjected to a focusing action by the non-immersion type magnetic field lens 119, decelerated by the first deceleration electric field 130 and the second deceleration electric field 131, and irradiated to the sample 103. On the other hand, in the case of the immersion mode, the primary electron beam 112 is subjected to a focusing action by the immersion type magnetic field lens 120 after being decelerated by the first deceleration electric field 130, decelerated by the second deceleration electric field 131 formed on the sample 103, and irradiated to the sample 103. In this manner, by accelerating the primary electron beam 112 by the boosting electrode 113, the primary electron beam 112 obtains high energy and is subjected to the focusing action by the magnetic field lens. Accordingly, it is possible to reduce aberration of the primary electron beam 112 generated at the time of passing through the magnetic field lens.

The primary electron beam 112 focused by the lens action scans the sample by a deflection action of a scanning coil. When the sample 103 is irradiated with the primary electron beam 112, the signal electrons 121 are emitted. The signal electrons 121 are detected by the in-housing detectors 122 or the sample chamber detector 123.

The deceleration effect of the first deceleration electric field 130 and the second deceleration electric field 131 can be controlled by controlling the voltage applied to the control electrode 114. For example, when it is desired to reduce the second deceleration electric field 131 on the sample by inclining the sample with respect to a sample having a surface form that is non-axisymmetric to the optical axis 110 or with respect to the optical axis, a potential of the control electrode 114 may be controlled to be close to the sample potential.

When it is desired to increase the resolution of the immersion type magnetic field lens 120, the voltage value of the control electrode 114 is high so as to strengthen the second deceleration electric field 131. Further, when it is desired to observe an inclined sample or a sample having irregularities on the surface while increasing the resolution of the non-immersion type magnetic lens 119, the voltage value of the control electrode 114 is close to the potential of the second pole piece and the sample so as to weaken the second deceleration electric field 131.

In this way, in each mode of the objective lens, high resolution observation is possible without depending on the sample form. That is, distortion of the deceleration electric field on the sample, which is a problem in boosting the objective lens, can be prevented by the control electrode 114.

In addition, when the signal electrons 121 are secondary electrons having a low energy of about 50 eV, the signal electrons 121 are absorbed into the SEM housing 102 by the second deceleration electric field 131. On the other hand, backscattered electrons having relatively high energy as compared to secondary electrons travel straight without being focused by the second deceleration electric field 131. Therefore, secondary electrons and backscattered electrons can be discriminated by the intensity of the first and second deceleration electric fields 131 and arrangements of the detectors.

FIGS. 4A to 4C are cross-sectional views of a division unit 141 of various components forming the objective lens. FIG. 4A shows a state in which the division unit 141 is divided from the SEM. The division unit 141 in FIG. 4B is constituted by the sample side distal end portion of the boosting electrode, the control electrode, the sample side distal end portion of the first pole piece, and the sample side distal end portion of the second pole piece. FIG. 4C shows an example in which the sample side distal end portion of the first pole piece is not provided in the division unit 141. Thus, various components can be detachable from the SEM as necessary. This leads to easy repair when an electrode or a pole piece that forms the objective lens is contaminated by adhesion of impurities, adsorption of gas, and the like or damaged by an interference substance, thereby improving maintainability.

FIG. 5 is a cross-sectional view of an in-housing detector 122 mounted on a division position. In this case, the repair becomes easy when a yield of the signal electrons is reduced due to contamination of the detection surface or when the detector fails. In addition to the in-housing detector 122, a deflector for deflecting the electron beam or a throttle hole for differential exhaustion may also be mounted in the division position. Therefore, by using the division unit 141, there is an advantage that the insertion of other components into the division position becomes easy.

In the division unit 141, the boosting electrode, the control electrode, the first pole piece, and the second pole piece are fixed using an insulating member 140 (resin material, ceramic material, or the like) since they are required to be electrically independent from each other.

FIGS. 6A to 6D are schematic views of methods of fixing the division unit, in which FIG. 6A shows a method of fixing the division unit to an upper second pole piece 116a directly with a screw, FIG. 6B shows a method of fixing a lower second pole piece 116b directly to a screw cut in the upper second pole piece 116a, and FIGS. 6C and 6D show a method of fixing the division unit using insulators such as a resin material and a ceramic material. The lower second pole piece is fixed to the upper second pole piece in FIG. 6C and is fixed to the first pole piece in FIG. 6D. In any case, it is premised that end surfaces of the upper second pole piece and the lower second pole piece are joined without a gap. In addition, a fixing method using fixation by fitting of resin and adsorption by magnetism is possible.

In order to exhibit the performance of the objective lens, it is necessary to align central axes of the magnetic field lens and the electric field lens. That is, the assembling accuracy of positions of the first and second pole pieces forming the magnetic field lens, the boosting electrode and the control electrode forming the electric field lens is important. In the present embodiment, there is an advantage that the assembly efficiency can be improved by downsizing, and the division unit can be provided as a consumable product by assembling the components requiring the assembling accuracy as the division unit.

FIGS. 7A and 7B are schematic views of methods of introducing a voltage to the control electrode, in which FIG. 7A shows a method of introducing a voltage from the division position of the second pole piece, and FIG. 7B shows a method of introducing a voltage from a hole formed in the side surface of the second pole piece. It is preferable to provide two to four holes in axial symmetry. The method of introducing a voltage to the lower boosting electrode 113b may be a method of bonding to the upper boosting electrode 113a at the division position or a method of introducing a voltage from outside of the second pole piece in the same manner as the control electrode. As a method of joining, joining using a spring, joining using a cable, and the like are possible.

According to the first embodiment, by adding a control electrode in addition to the boosting electrode for accelerating the charged particle beam, it is possible to realize high resolution observation by electric field superimposition regardless of the mode of the objective lens. Further, it is also possible to provide a charged particle beam device that achieves both high resolution observation and electromagnetic field free observation on a sample. Further, by forming the sample side distal end portion of the pole piece and the electrode into division units and making them a detachable structure, it is possible to stably provide the function by improving the assemblability and the maintainability.

Second Embodiment

FIG. 8 is a schematic view of FIB-SEM (Focused Ion Beam, also referred to as a composite charged particle beam device). In the FIB-SEM, an FIB housing 170 is mounted toward a sample, and processing of the sample is performed by the FIB. Generally, in the FIB-SEM, the sample is inclined so that the sample is orthogonal to the central axis of the FIB housing 170 during processing by the FIB, and processing by an ion beam is performed. Therefore, when a deceleration electric field is formed between an objective lens and the sample, the electric field is distorted due to the inclination of the sample, and degradation of lens performance may occur such as an irradiation position of a primary electron beam on the sample and the resolution degradation of the SEM. Therefore, in a device that inclines a sample with respect to the SEM housing 102 such as FIB-SEM, control of the deceleration electric field formed between the objective lens and the sample is important. In the present embodiment, by controlling the deceleration electric field between the objective lens and the sample by the control electrode, an effect of improving the resolution by boosting can be obtained even for an inclined sample.

Further, as an SEM objective lens of the FIB-SEM, it is also effective to use a distal end portion of the objective lens as a division unit. When the sample is processed by the FIB, sputtered particles (atoms and molecules) are sputtered from the sample. When the sputtered particles adhere to the distal end portion of the objective lens, problems such as discharge may occur due to deterioration of the performance of an in-housing detector and degradation of the insulation performance between electrodes. Therefore, a detachable structure using sample side distal end portions of pole pieces and an electrode as a division unit has an advantage that these components can be easily replaced when a problem of the in-housing detector or the electrode occurs.

REFERENCE SIGN LIST 100 base frame
101 sample chamber
102 SEM housing
103 sample
104 monitor
105 control unit
110 optical axis
111 electron source
112 primary electron beam
113 boosting electrode
113a upper boosting electrode
113b lower boosting electrode
114 control electrode
115 first pole piece
116 second pole piece
116a upper second pole piece
116b lower second pole piece
117 first lens coil
118 second lens coil.
119 non-immersion type magnetic field lens
120 immersion type magnetic field lens
121 signal electrons
122 in-housing detector
123 sample chamber detector
130 first deceleration electric field
131 second deceleration electric field
132 inclined sample
140 electrode fixing component
141 division unit
150 division unit fixing screw
151 division unit fixing component
160 voltage introduction line
161 voltage introduction single piece terminal
170 FIB housing

The invention claimed is:

1. A charged particle beam device, comprising:
a charged particle source that emits a charged particle beam;
a boosting electrode disposed between the charged particle source and a sample to form a path of the charged particle beam and accelerate and decelerate the charged particle beam;
a first pole piece that covers the boosting electrode;
a second pole piece that covers the first pole piece;
a first lens coil disposed outside the first pole piece and inside the second pole piece to form a first lens;
a second lens coil disposed outside the second pole piece to form a second lens; and
a control electrode formed between a distal end portion of the first pole piece and a distal end portion of the second pole piece to control an electric field formed between the sample and the distal end portion of the second pole piece;
wherein the second pole piece includes two to four through holes that are axisymmetric on a side surface of the second pole piece and introduce a voltage to the control electrode.

2. The charged particle beam device according to claim 1, wherein the first lens is a non-immersion type lens and the second lens is an immersion type lens.

3. The charged particle beam device according to claim 1, further comprising:
a division unit detachably formed on the charged particle beam device, wherein the division unit includes a distal end portion of the second pole piece on the sample side.

4. The charged particle beam device according to claim 3, wherein
the division unit further includes the control electrode and a distal end portion of the boosting electrode on the sample side.

5. The charged particle beam device according to claim 3, wherein
a component is insertable into the charged particle beam device into a division position between the division unit and the charged particle source.

6. A charged particle beam device, comprising:
a charged particle source that emits a charged particle beam;
a boosting electrode disposed between the charged particle source and a sample to form a path of the charged particle beam and accelerate and decelerate the charged particle beam;
a first pole piece that covers the boosting electrode;
a second pole piece that covers the first pole piece;
a first lens coil disposed outside the first pole piece and inside the second pole piece to form a first lens;
a second lens coil disposed outside the second pole piece to form a second lens;
a control electrode formed between a distal end portion of the first pole piece and a distal end portion of the second pole piece to control an electric field formed between the sample and the distal end portion of the second pole piece; and
a division unit detachably formed on the charged particle beam device, wherein
the division unit includes a distal end portion of the second pole piece on the sample side,
a component is insertable into the charged particle beam device into a division position between the division unit and the charged particle source, and
the component is a detector that detects charged particles generated from the sample.

7. A charged particle beam device, comprising:
a charged particle source that emits a charged particle beam;
a boosting electrode disposed between the charged particle source and a sample to form a path of the charged particle beam and accelerate and decelerate the charged particle beam;
a first pole piece that covers the boosting electrode;
a second pole piece that covers the first pole piece;
a first lens coil disposed outside the first pole piece and inside the second pole piece to form a first lens;
a second lens coil disposed outside the second pole piece to form a second lens;
a control electrode formed between a distal end portion of the first pole piece and a distal end portion of the second pole piece to control an electric field formed between the sample and the distal end portion of the second pole piece; and
a division unit detachably formed on the charged particle beam device, wherein
the division unit includes a distal end portion of the second pole piece on the sample side,
a component is insertable into the charged particle beam device into a division position between the division unit and the charged particle source, and
the component is a throttle hole for vacuum differential exhaustion.

8. The charged particle beam device according to claim 5, wherein the component is a deflector that deflects a charged particle beam.

9. The charged particle beam device according to claim 1, wherein the boosting electrode, the control electrode, the second pole piece, and the sample are disposed electrically independent of one another, and $V_s \leq V_c \leq V_b$ is satisfied when a voltage applied to the sample is defined as $V_s$, a voltage applied to the control electrode is defined as $V_c$, and a voltage applied to the boosting electrode is defined as $V_b$.

10. The charged particle beam device according to claim 1, wherein the distal end portions of the first and second pole pieces on the sample side, and distal end portions of the boosting electrode and the control electrode on the sample side have an axisymmetric hollow cone shape, the distal end portion of the boosting electrode on the sample side is located between the distal end portion of the first pole piece on the sample side and the distal end portion of the second pole piece on the sample side, and the distal end portion of the control electrode on the sample side is located between the distal end portion of the boosting electrode on the sample side and the distal end portion of the second pole piece on the sample side.

* * * * *